(12) United States Patent
Ohmori et al.

(10) Patent No.: US 7,723,849 B2
(45) Date of Patent: May 25, 2010

(54) SEMICONDUCTOR DEVICE AND MANUFACTURING METHOD THEREOF

(75) Inventors: Kazutoshi Ohmori, Higashihiroshima (JP); Tsuyoshi Tamaru, Hachioji (JP); Naohumi Ohashi, Tokyo (JP); Kiyohiko Sato, Ome (JP); Hiroyuki Maruyama, Ome (JP)

(73) Assignee: Renesas Technology Corp., Tokyo (JP)

( * ) Notice: Subject to any disclaimer, the term of this patent is extended or adjusted under 35 U.S.C. 154(b) by 670 days.

(21) Appl. No.: 11/646,434

(22) Filed: Dec. 28, 2006

(65) Prior Publication Data

US 2007/0105369 A1      May 10, 2007

Related U.S. Application Data

(62) Division of application No. 10/684,399, filed on Oct. 15, 2003, now Pat. No. 7,176,121.

(30) Foreign Application Priority Data

Oct. 17, 2002  (JP)  ............................ P2002-302689
Sep. 3, 2003   (JP)  ............................ P2003-310953

(51) Int. Cl.
     *H01L 23/48*     (2006.01)
(52) U.S. Cl. ........................ 257/758; 438/638; 438/624; 257/E21.576
(58) Field of Classification Search ................ 438/622, 438/623, 624, 638, 778, 780, 781, 782, 787, 438/790, 793, 794; 257/758, 759, 760, E21.576, 257/E21.579
See application file for complete search history.

(56) References Cited

U.S. PATENT DOCUMENTS

| | | | |
|---|---|---|---|
| 6,255,217 B1 | 7/2001 | Agnello et al. | ............ 438/687 |
| 6,340,435 B1 | 1/2002 | Bjorkman et al. | ............ 216/72 |
| 6,479,408 B2 | 11/2002 | Shioya et al. | ............ 438/789 |
| 6,670,710 B2 * | 12/2003 | Matsunaga | ............ 257/758 |
| 6,828,229 B2 | 12/2004 | Lee et al. | ............ 438/638 |
| 2001/0054765 A1 | 12/2001 | Ohto et al. | ............ 257/751 |
| 2002/0168849 A1 | 11/2002 | Lee et al. | ............ 438/637 |
| 2002/0192945 A1 | 12/2002 | Nagahara | ............ 438/637 |
| 2003/0030146 A1 | 2/2003 | Tamaru et al. | ............ 257/762 |

(Continued)

FOREIGN PATENT DOCUMENTS

JP      2000-200832      7/2000

(Continued)

*Primary Examiner*—David Vu
(74) *Attorney, Agent, or Firm*—Miles & Stockbridge P.C.

(57) ABSTRACT

A semiconductor device and a manufacturing method thereof are provided for the improvement of the reliability of copper damascene wiring in which a film between wiring layers and a film between via layers are comprised of an SiOC film with low dielectric constant. A film between wiring layers, a film between wiring layers, and a film between via layers are respectively comprised of an SiOC film, and stopper insulating films and a cap insulating film are comprised of a laminated film of an SiCN film A and an SiC film B. By doing so, it becomes possible to reduce the leakage current of the film between wiring layers, the film between wiring layers, and the film between via layers, and also possible to improve the adhesion of the film between wiring layers, the film between wiring layers, and the film between via layers to the stopper insulating films and the cap insulating film.

13 Claims, 9 Drawing Sheets

U.S. PATENT DOCUMENTS

2004/0161535 A1    8/2004    Goundar et al. ........ 427/249.15

FOREIGN PATENT DOCUMENTS

| | | |
|---|---|---|
| JP | 2001-110789 | 4/2001 |
| JP | 2001-326279 | 11/2001 |
| JP | 2002-9150 | 1/2002 |
| JP | 2002-134494 | 5/2002 |
| JP | 2002-170882 | 6/2002 |
| JP | 2002-203899 | 7/2002 |
| JP | 2002-270691 | 9/2002 |
| JP | 2002-324837 | 11/2002 |
| JP | 2002-353310 | 12/2002 |
| JP | 2002-373936 | 12/2002 |
| JP | 2003-60030 | 2/2003 |
| JP | 2003-142593 | 5/2003 |
| JP | 2003-152076 | 5/2003 |

* cited by examiner

SEMICONDUCTOR DEVICE AND MANUFACTURING METHOD THEREOF

CROSS-REFERENCE TO RELATED APPLICATION

This application is a division of application Ser. No. 10/684,399 filed Oct. 15, 2003 now U.S. Pat. No. 7,176,121.

TECHNICAL FIELD OF THE INVENTION

The present invention relates to a technique for manufacturing a semiconductor device. More particularly, the present invention relates to a technique effectively applied to a wiring structure formed by the so-called damascene process and to a semiconductor device with such a wiring structure.

BACKGROUND OF THE INVENTION

In order to suppress the wiring delay caused by the scaling down of the semiconductor device, the attempts to reduce the wiring resistance and the wiring capacitance have been made. With respect to the wiring resistance, the measures by means of design technique and the adoption of the wiring made of copper to be a main conductor layer have been examined. For the formation of the copper wiring, the so-called damascene process is employed, in which metal for the wiring such as copper to be the main conductor layer is deposited on a substrate and on the surface of the trenches formed in an insulating film and then the superfluous metal outside the trenches is removed by the CMP (Chemical Mechanical Polishing) method, thus forming the wiring patterns in the trenches.

Meanwhile, with respect to the wiring capacitance, the adoption of the low dielectric constant material with the relatively low relative dielectric constant of about 2 to 3 has been examined. Above all, the film made of silicon-oxycarbite (referred to as SiOC, hereinafter) which is excellent in mechanical strength is considered as a promising low dielectric constant material.

Note that Japanese Patent Laid-Open No. 2001-326279 (Patent Document 1) discloses the technique, in which the insulating film that comes into contact with the copper wiring of the multilayered insulating film constituting the interlayer insulating film is formed by plasmanizing the film forming gas containing the alkyl compound having the siloxane bond and any one oxygen-containing gas of $NH_2O$, $H_2O$, and $CO_2$, whose flow rate is equal to or less than the flow rate of the alkyl compound, and then reacting them mutually.

Also, Japanese Patent Laid-Open No. 2001-110789 (Patent Document 2) discloses the method of depositing and etching the intermetallic dielectric layer comprised of the first dielectric layer containing silicon, oxygen, and about 5% of carbon by atomic weight and the second dielectric layer containing silicon, oxygen, and about two-thirds or less of the carbon contained in the first dielectric layer.

Also, Japanese Patent Laid-Open No. 2002-203899 (Patent Document 3) discloses the technique for improving the adhesion between the interlayer insulating film and the barrier film by forming the interlayer insulating film with an SiO film, an SiOF film or an SiOC film and by forming the copper barrier film with an SiC film.

Also, Japanese Patent Laid-Open No. 2002-134494 (Patent Document 4) discloses the technique for preventing the crosstalk by forming the interlayer insulating film with an SiOC film, an SiOF film, or a CF film and forming the polishing stopper film for the CMP (Chemical Mechanical Polishing) and the copper barrier film with an SiC film.

Also, Japanese Patent Laid-Open No. 2002-353310 (Patent Document 5) discloses the technique for improving the etching of the vias by forming the interlayer insulating film with an SiOC film and forming the copper barrier film with an SiC film or an SiN film.

Also, Japanese Patent Laid-Open No. 2003-142593 (Patent Document 6) discloses the technique for forming an MIM (Metal Insulator Metal) capacitor by forming the interlayer insulating film with an SiO film, an SiOF film, or an SiOC film and forming the copper barrier film with an SiC film or an SiN film.

Also, Japanese Patent Laid-Open No. 2003-152076 (Patent Document 7) discloses the technique for improving the dielectric breakdown resistance of the wiring by forming the interlayer insulating film with an SiOC film, an SiOF film, a BF film, or a CF film, forming the polishing stopper film for the CMP with an SiC film, an SiN film, an SiO film, or an SiON film, and forming the copper barrier film with an SiOC film or an SiON film.

Also, Japanese Patent Laid-Open No. 2000-200832 (Patent Document 8) discloses the technique for improving the adhesion of the copper barrier film by forming the interlayer insulating film with an SiO film, an SiOF film, or an SiN film and forming the copper barrier film with an SiC film or an SiN film.

Also, Japanese Patent Laid-Open No. 2002-9150 (Patent Document 9) discloses the technique for preventing the aggregation of copper wiring by forming the copper diffusion preventing film of the copper damascene wiring to have a laminated structure of the first insulating film comprised of an SiN film, an SiC film, or an SiCN film and the second insulating film comprised of an SiN film.

Also, Japanese Patent Laid-Open No. 2002-373936 (Patent Document 10) discloses the technique in which an SiC film, an SiN film, an SiCN film, or an SiON film is used as the etching stopper film when forming the copper damascene wiring.

Also, Japanese Patent Laid-Open No. 2002-170882 (Patent Document 11) and Japanese Patent Laid-Open No. 2002-270691 (Patent Document 12) disclose the technique in which, in the process for forming the copper damascene wiring, after performing the CMP for filling copper into the trenches in the insulating film, the surface treatment of exposing the copper surface to the plasma of ammonia ($NH_3$) or helium (He) is performed, and then, a copper diffusion preventing film such as an SiC film, an SiN film, or an SiCN film is formed.

SUMMARY OF THE INVENTION

The inventors of the present invention have examined the manufacturing method of the damascene wiring. The technique examined by the inventors of the prevent invention will be shown below, and the summary thereof will be provided as follows.

First, a stopper insulating film and an insulating film for forming the wiring (referred to as film between wiring layers, hereinafter) are sequentially deposited. The film between wiring layers is comprised of an SiOC film formed by the plasma CVD (Chemical Vapor Deposition) method, and the stopper insulating film is comprised of a silicon oxide (referred to as SiO, hereinafter) film, a silicon nitride (referred to as SiN, hereinafter) film, or a silicon carbonitride (referred to as SiCN, hereinafter) film formed by, for example, the plasma CVD method. The stopper insulating film functions as an etching stopper layer in the etching of the film between wiring layers.

Next, the wiring trenches are formed in the predetermined region of the film between wiring layers and the stopper insulating film by the etching with using the patterned photoresist film as a mask. Subsequently, a barrier film, for example, a titanium nitride film is formed on the entire surface of the substrate including the surface of the wiring trenches, and then, a copper film for filling the wiring trenches is formed. The copper film functions as a main conductor layer and can be formed by, for example, the plating method. Thereafter, the copper film and the barrier layer in the region outside the wiring trenches are removed by the CMP method, thus forming the copper wiring in the wiring trenches.

Next, a cap insulating film functioning as a barrier layer is formed on the copper wiring in order to prevent the diffusion of the copper from the copper wiring. The cap insulating film is comprised of, for example, an SiO film, an SiN film, or an SiCN film formed by the plasma CVD method. In addition to the function as a barrier layer, the cap insulating film has a function as an etching stopper layer when forming connection holes in the insulating film on the copper wiring.

However, as a result of the examination of the scaling down of the damascene wiring with the process dimensions of 0.1 μm or smaller with the increasing demand for the higher integration density, the problem as follows has been found out. That is, when polishing the copper film by the CMP method, the film between wiring layers, which is comprised of an SiOC film, and the stopper insulating film comprised of an SiO film, an SiN film or an SiCN film are separated from each other at the interface therebetween, and the manufacturing yield of the semiconductor device having the damascene wiring is lowered.

An object of the present invention is to provide a technique capable of improving the reliability of the damascene wiring in which an SiOC film is used to form the insulating film in which the wiring trenches are formed or the insulating film in which the connection holes are formed.

The above and other objects and novel characteristics of the present invention will be apparent from the description and the accompanying drawings of this specification.

The typical ones of the inventions disclosed in this application will be briefly described as follows.

The present invention provides an semiconductor device in which metal wiring is formed in the trenches formed in an interlayer insulating film on a semiconductor substrate and a cap insulating film for preventing the diffusion of the metal which constitutes the wiring is formed over the interlayer insulating film and the metal wiring, wherein the interlayer insulating film is comprised of an SiOC film, an SiC film formed on the SiOC film, and an SiON film formed on the SiC film, and the cap insulating film is comprised of an SiCN film and an SiC film formed on the SiCN film.

The present invention provides the method of manufacturing a semiconductor device having the damascene wiring, wherein an insulating film in which the wiring trenches are formed and an insulating film in which the connection holes are formed are comprised of an SiOC film, and an SiC film with a thickness of 5 nm or larger is deposited so as to be in contact with the SiOC film.

The effect obtained by the typical ones of the inventions disclosed in this application will be briefly described as follows.

In the damascene wiring in which an SiOC film is used to form an insulating film in which the wiring trenches are formed and an insulating film in which the connection holes are formed, an SiC film is used to form the stopper insulating film and the cap insulating film, alternatively, a laminated structure comprised of an SiCN film, an SiOC film, and an SiC film interposed between the SiCN film and the SiOC film is used to form the stopper insulating film and the cap insulating film. By doing so, it is possible to prevent the separation of the SiOC film. In this manner, it is possible to improve the reliability of the damascene wiring.

DESCRIPTION OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof is omitted.

First Embodiment

The manufacturing method of the CMOSFET (Complementary Metal Oxide Semiconductor Field Effect Transistor) according to the first embodiment of the present invention will be described along the manufacturing process with reference to the sectional views in FIGS. 1 to 7 showing the principal part of the semiconductor substrate shown.

Figure 1:
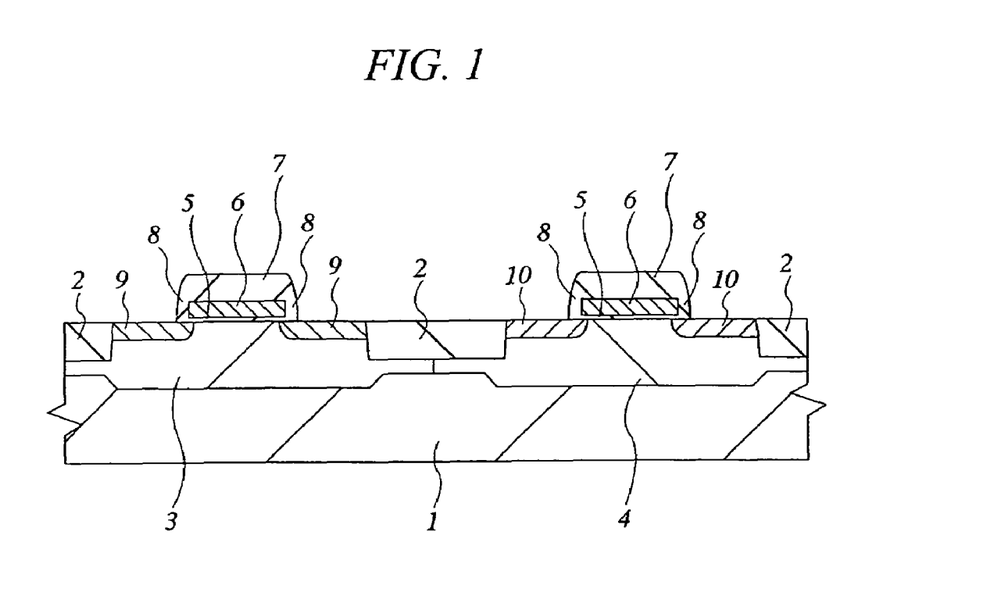
FIG. 1 is a sectional view showing the principal part of a semiconductor substrate which illustrates the manufacturing method of the CMOSFET according to the first embodiment of the present invention.

First, as shown in FIG. 1, a semiconductor substrate 1 made of, for example, p-single crystal silicon is prepared and device isolation regions 2 are formed on the main surface of the semiconductor substrate 1. Next, an impurity is ion-implanted with using a patterned photoresist film as a mask to form a p-well 3 and an n-well 4. A p-type impurity such as boron is ion-implanted into the p-well 3, and an n-type impurity such as phosphorus is ion-implanted into the n-well 4. Thereafter, the impurity for controlling the threshold of the MISFET (Metal Insulator Semiconductor FET) can be ion-implanted into the respective well regions.

Next, a silicon oxide film to be a gate insulating film 5, a polycrystalline silicon film to be a gate electrode 6, and a silicon oxide film to be a cap insulating film 7 are sequentially deposited to form a laminated film, and then, the laminated film is etched with using a patterned photoresist film as a mask. In this manner, the gate insulating films 5, gate electrodes 6, and the cap insulating films 7 are formed.

Next, after depositing a silicon oxide film by, for example, the CVD method, sidewall spaces 8 are formed on the sidewalls of the gate electrodes 6 by the anisotropic etching of this silicon oxide film. Thereafter, an n-type impurity such as phosphorus or arsenic is ion-implanted into the p-well 3 with using a photoresist film as a mask to form the n-type semiconductor regions 9 on both sides of the gate electrode 6 of the p-well 3. The n-type semiconductor regions 9 are formed in the self-alignment manner with respect to the gate electrode 6 and the sidewall spacers 8 and function as the source/drain of the n-channel MISFET. Similarly, a p-type impurity such as boron fluoride is ion-implanted into the n-well 4 with using a photoresist film as a mask to form the p-type semiconductor regions 10 on both sides of the gate electrode 6 of the n-well 4. The p-type semiconductor regions 10 are formed in the self-alignment manner with respect to the gate electrode 6 and the sidewall spacers 8 and function as the source/drain of the p-channel MISFET.

Figure 2:
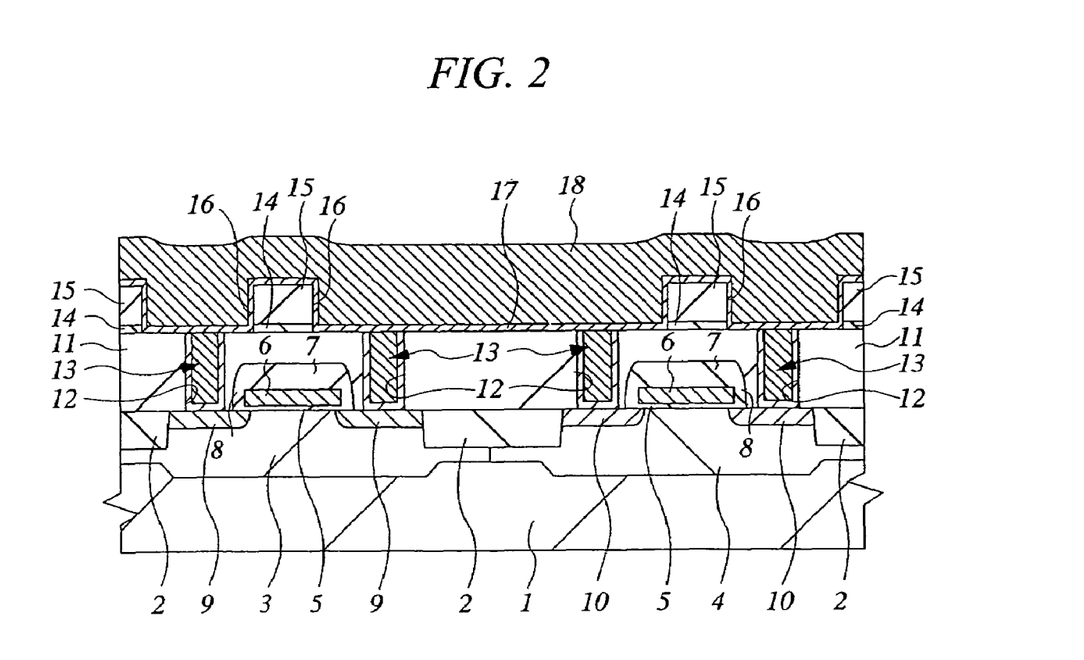
FIG. 2 is a sectional view showing the principal part of the semiconductor substrate which illustrates the manufacturing method of the CMOSFET according to the first embodiment of the present invention.

Next, as shown in FIG. 2, after depositing a silicon oxide film on the semiconductor substrate 1 by the sputtering method or the CVD method, the silicon oxide film is polished by the CMP method. By doing so, an interlayer insulating film 11 having a flat surface is formed. Subsequently, connection holes 12 are formed in the interlayer insulating film 11 by the etching with using a patterned photoresist film as a mask. The connection holes are formed at the required positions, for example, on the n-type semiconductor regions 9 or on the p-type semiconductor regions 10.

Next, a titanium nitride film is formed on the entire surface of the semiconductor substrate 1 including the surface of the connection holes 12 by, for example, the CVD method, and then, a tungsten film to be filled into the connection holes 12 is formed by, for example, the CVD method. Thereafter, the tungsten film and the titanium nitride film in the region other than in the connection holes 12 are removed by, for example, the CMP method, thus forming the plugs 13 in the connection holes 12.

Subsequently, a first wiring layer is formed by using the single damascene process. First, a stopper insulating film 14 is formed on the plugs 13 and a film between wiring layers 15 is formed. Since the first wiring layer described later is formed on the stopper insulating film 14 and the film between wiring layers 15, the total thickness thereof is determined depending on the design thickness necessary to the first wiring layer.

The stopper insulating film 14 is a film serving as an etching stopper in the process for forming the wiring trench in the film between wiring layers 15 and is made of a material having the etching selectivity with respect to the film between wiring layers 15. The stopper insulating film 14 is comprised of a silicon carbide (referred to as SiC, hereinafter) film with nitrogen content of 1% or less, and its thickness can be, for example, about 5 nm or larger. The SiC film is formed by, for example, the plasma CVD method under the conditions as follows. That is, the rf power is 200 to 1000 W, the pressure is 2 to 10 Torr, the temperature is 300 to 400° C., the gas seed is C containing gas (e.g. alkylsilane) and He, and the gas flow rate is 100 to 2000 sccm. The film between wiring layers 15 is comprised of an SiOC film and has a relative dielectric constant of about 3. Also, the SiOC is formed under the conditions as follows. That is, the rf power is 200 to 1000 W, the pressure is 2 to 10 Torr, the temperature is 300 to 400° C., the gas seed is C containing gas (e.g. alkylsilane), He, and $O_2$, and the gas flow rate is 100 to 2000 sccm.

Note that the SiC film constituting the stopper insulating film 14 and the SiOC film constituting the film between wiring layers 15 can be formed with one plasma CVD apparatus. For example, the following two methods can be used: that is, the one in which the SiC film and the SiOC film are respectively formed in the two chambers provided in the plasma CVD apparatus; and the one in which the SiC film and the SiOC film are successively formed in the single chamber under different film forming conditions such as the gas to be used.

Subsequently, wiring trenches 16 are formed in the predetermined regions of the stopper insulating film 14 and the film between wiring layers 15 by the etching with using a patterned photoresist film as a mask.

Next, a barrier metal layer 17 is formed over the entire surface of the semiconductor substrate 1 including the surfaces of the wiring trenches 16. The barrier metal layer 17 is comprised of, for example, a tantalum film and has a thickness of about 50 nm on the flat surface of the substrate. The tantalum film is formed by, for example, the sputtering method. It is also possible to form the barrier metal layer 17 with titanium nitride or tantalum nitride.

Subsequently, a seed layer of copper (not shown) is formed on the barrier metal layer 17 by, for example, the CVD method or the sputtering method, and then, a copper film 18 is formed on the seed layer by the electroplating method.

Figure 3:
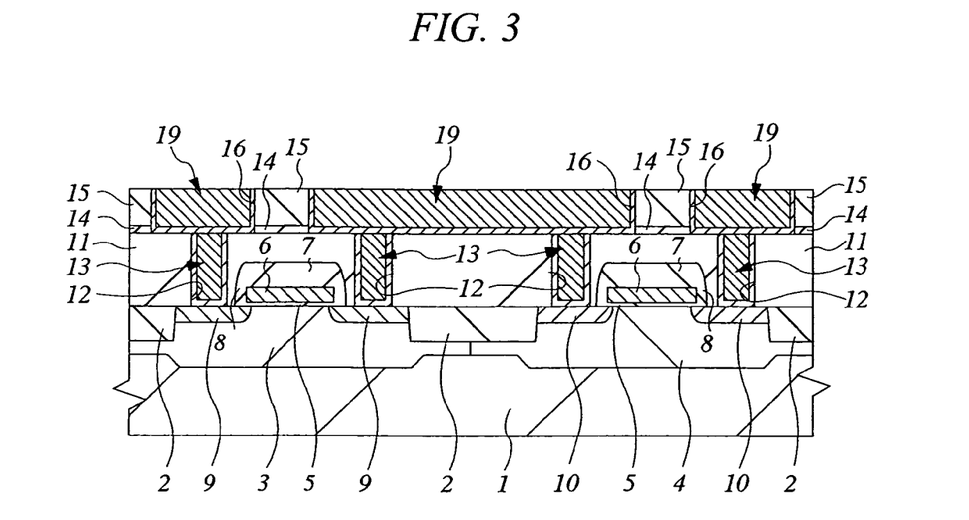
FIG. 3 is a sectional view showing the principal part of the semiconductor substrate which illustrates the manufacturing method of the CMOSFET according to the first embodiment of the present invention.

Next, as shown in FIG. 3, the copper film 18 and the seed layer are polished by the CMP method. Thereafter, the barrier metal layer 17 on the film between wiring layers 15 is removed by the further polishing. In this manner, the copper film 18 (including the seed layer) and the barrier metal layer 17 in the region other than the wiring trenches 16 are removed and the wiring 19 of the first wiring layer is formed.

Incidentally, in the technique examined by the inventors of this invention in which the stopper insulating film is comprised of an SiO film, an SiN film or an SiCN film and the film between wiring layers is comprised of an SiOC film, the stopper insulating film and the film between wiring layers are separated from each other at the interface thereof in the CMP process of the copper film and the barrier layer. However, in the first embodiment in which the stopper insulating film 14 is comprised of an SiC film and the film between wiring layers 15 is comprised of an SiOC film, the stopper insulating film (SiC film) 14 and the insulating film (SiOC film) 15 have been not separated from each other at the interface thereof in the CMP process of the copper film (including the seed layer) and the barrier metal layer 17.

TABLE 1

|  | SiOC | SiC | SiO | SiCN | SiN |
| --- | --- | --- | --- | --- | --- |
| Young's Modulus (GPa) | 18 | 63 | 112 | 133 | 221 |
| Stress (MPa) | 47 | 62 | −140 | −245 | −151 |
| Nitrogen Content (%) | <1 | <1 | 4 | 20 | 45 |

The Young's modulus, stress, and nitrogen content of each insulating film are shown in Table 1. The adhesion between the SiOC film and each of the insulating films becomes smaller in the order of the SiN film, SiCN film, SiO film, and SiC film, and the adhesion to the SiOC film tends to depend on the nitrogen content. Also, the Young's modulus becomes smaller in the order of SiN film, SiCN film, SiO film, SiC film, and SiOC film. In addition, the SiOC film and the SiC film show the tensile stress, and on the other hand, the SiN film, the SiCN film, and the SiO film show the compressive stress.

Judging from the above, it is thought that the molecular structure terminated by O and C enhances the bond between the molecules at the interface to improve the adhesion at the interface of the SiOC film. Furthermore, if the SiC film which has the tensile stress similar to the SiOC film, the difference in Young's modulus from the SiOC film of 50 GPa or less, and the difference in stress of 50 MPa or less is provided so as to come into contact with the SiOC film, the SiC film can relax the load in the horizontal and the vertical directions generated during the CMP process of the copper film, and thereby reducing the separation at the interface between the SiOC film and the SiC film.

Note that the case where an SiC film is used as the stopper insulating film 14 has been exemplified here. However, it is also possible to form the stopper insulating film 14 with other insulating film if it has the difference in Young's modulus from the SiOC film of 50 GPa or less, or the difference in stress of 50 MPa or less. Also, the case where the SiC film constituting the stopper insulating film 14 is formed by the plasma CVD method and the film forming conditions have been exemplified here. However, the process and the film forming conditions are not limited to those described here.

Figure 4:
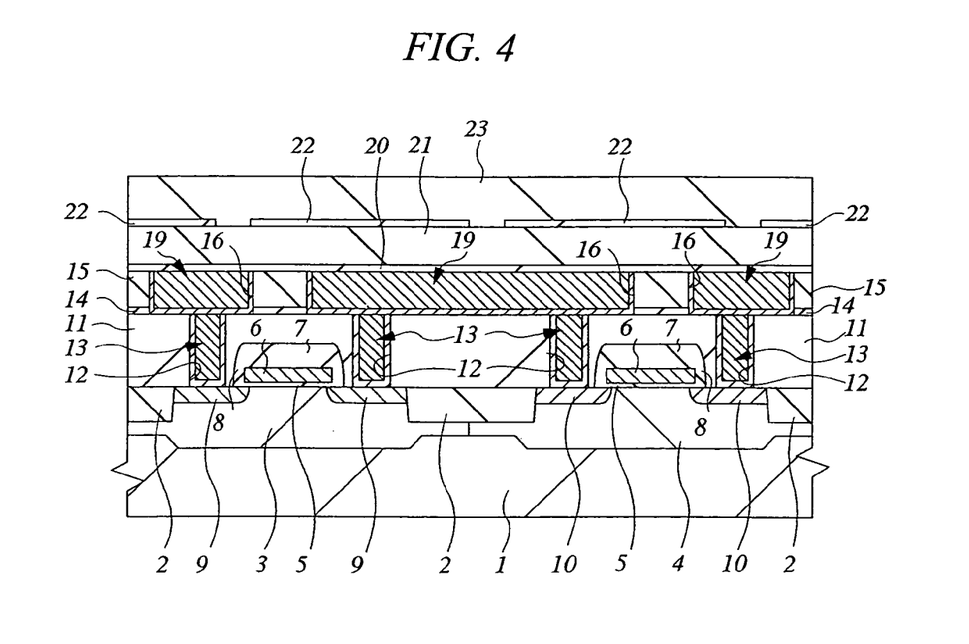
FIG. 4 is a sectional view showing the principal part of the semiconductor substrate which illustrates the manufacturing method of the CMOSFET according to the first embodiment of the present invention.

Next, a second wiring layer is formed by the dual damascene process. First, as shown in FIG. 4, a cap insulating film 20, an insulating film in which connection holes are to be formed (referred to as film between via layers, hereinafter) 21, and a stopper insulating film 22 for forming wiring are sequentially formed on the wiring 19 of the first wiring layer.

The cap insulating film 20 is comprised of an SiC film with a nitrogen content of 1% or less and a thickness of, for example, about 5 nm or larger. In addition, the cap insulating film 20 has a function to prevent the diffusion of copper. Also, it is made of a material having the etching selectivity with respect to the film between via layers 21 and is used as an etching stopper in the process for forming the connection holes in the film between via layers 21. The SiC film is formed by, for example, the plasma CVD method, and the film forming conditions approximately equal to those of the SiC film constituting the stopper insulating film 14 can be used.

The film between via layers 21 is comprised of an SiOC film, the SiOC film is formed by, for example, the plasma CVD method, and the film forming conditions approximately equal to those of the SiOC film constituting the film between wiring layers 15 can be used.

The stopper insulating film 22 is made of an insulating material having the etching selectivity with respect to a film between wiring layers deposited later on the film between via layers 21 and the stopper insulating film 22, and it is comprised of an SiC film with the nitrogen content of 1% or less with a thickness of, for example, about 5 nm or larger. The SiC film is formed by, for example, the plasma CVD method, and the film forming conditions approximately equal to those of the SiC film constituting the stopper insulating film 14 can be used.

Next, a photoresist film patterned into the hole shape is formed on the stopper insulating film 22, and the stopper insulating film 22 is etched with using the photoresist film as a mask.

Subsequently, a film between wiring layers 23 is formed on the stopper insulating film 22. The film between wiring layers 23 is comprised of an SiOC film. The SiOC film is formed by, for example, the plasma CVD method, and the film forming conditions approximately equal to those of the SiOC film constituting the film between wiring layers 15 can be used. Note that, since wiring trenches to which the second wiring layer described later is filled are formed in the stopper insulating film 22 and the film between wiring layers 23, the total thickness thereof is determined depending on the design thickness necessary to the second wiring layer.

Figure 5:
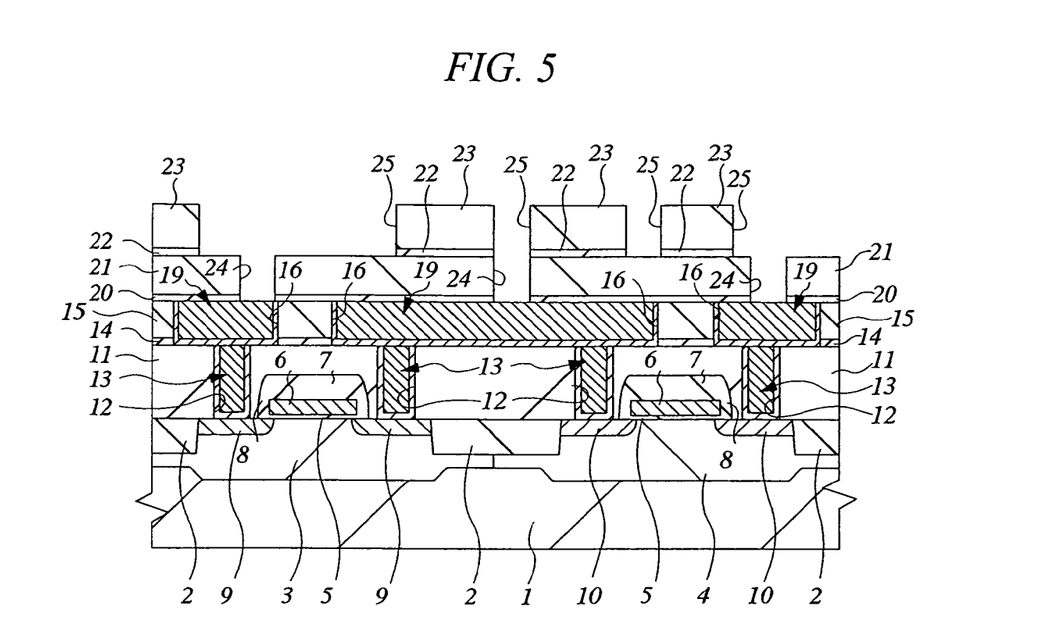
FIG. 5 is a sectional view showing the principal part of the semiconductor substrate which illustrates the manufacturing method of the CMOSFET according to the first embodiment of the present invention.

Thereafter, as shown in FIG. 5, a photoresist film patterned into the trench shape is formed on a film between wiring layers 23, and the film between wiring layers 23 is etched with using the photoresist film as a mask. In this case, the cap insulating film 22 functions as an etching stopper film.

Subsequently, the film between via layers 21 is etched with using the photoresist film and the stopper insulating film 22 as masks. In this case, the cap insulating film 20 functions as an etching stopper layer.

Subsequently, the exposed cap insulating film 20 is removed by, for example, the dry etching method. Simultaneous with the removal of the cap insulating film 20, the stopper insulating film 22 is also removed. In this manner, the connection holes 24 are formed in the cap insulating film 20 and the film between via layers 21, and the wiring trenches 25 are formed in the stopper insulating film 22 and the film between wiring layers 23.

Figure 6:
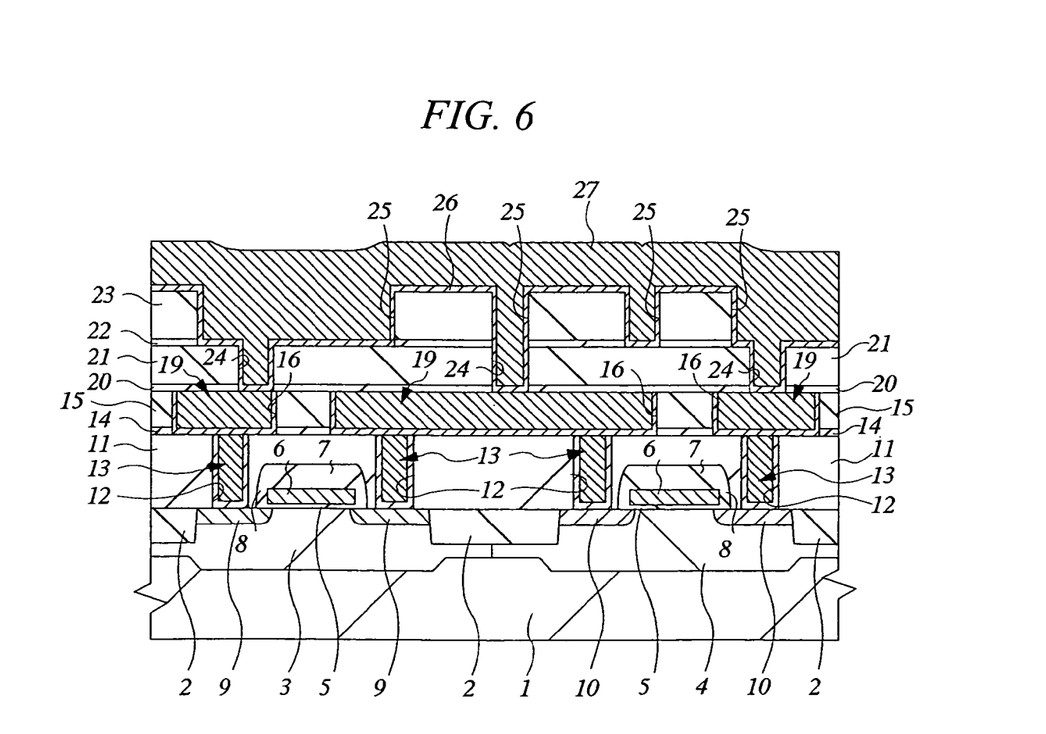
FIG. 6 is a sectional view showing the principal part of the semiconductor substrate which illustrates the manufacturing method of the CMOSFET according to the first embodiment of the present invention.

Next, as shown in FIG. 6, a barrier metal layer 26 is formed over the entire surface of the semiconductor substrate 1 including the surfaces of the connection holes 24 and the wiring trenches 25. The barrier metal layer 26 is comprised of, for example, a tantalum film and has a thickness of, for example, about 50 nm over the flat surface of the substrate. The tantalum film is formed by, for example, the sputtering method. It is also possible to form the barrier metal layer 26 with titanium nitride and tantalum nitride.

Subsequently, a seed layer (not shown) of copper is formed on the barrier metal layer 26 by, for example, the CVD method or the sputtering method, and a copper film 27 is formed on the seed layer by, for example, electroplating method.

Figure 7:
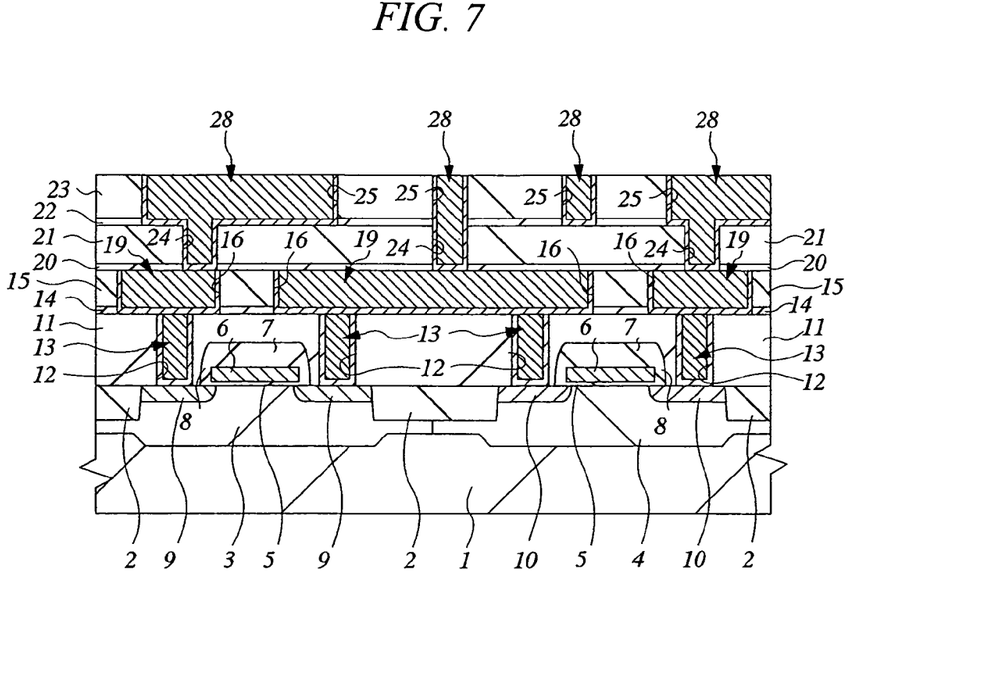
FIG. 7 is a sectional view showing the principal part of the semiconductor substrate which illustrates the manufacturing method of the CMOSFET according to the first embodiment of the present invention.

Next, as shown in FIG. 7, the copper film 27 and the seed layer are polished by the CMP method. Thereafter, the barrier metal layer 26 on the film between wiring layers 23 is removed by the further polishing. In this manner, the copper film 27 (including the seed layer) and the barrier metal layer 26 in the region other than the wiring trenches 25 are removed and the wiring 28 of the second wiring layer formed together with the connection member is formed.

Also in the CMP process of this copper film 27 (including the seed layer) and the barrier metal layer 26, similar to the CMP process of the copper film 18 (including the seed layer) and the barrier metal layer 17, no separation has been caused at the interface between the cap insulating film (SiC film) 20 and the film between via layers (SiOC film) 21, at the interface between the film between via layers (SiOC film) 21 and the stopper insulating film (SiC film) 22, and at the interface between the stopper insulating film (SiC film) 22 and the film between wiring layers (SiOC film) 23.

Subsequently, though not shown, a cap insulating film 29 is formed on the wiring 28 of the second wiring layer, and after forming the wiring in the upper layer, the entire surface of the semiconductor substrate 1 is coated with a passivation layer. In this manner, the CMOSFET is approximately completed.

Note that, although the CMOSFET is exemplified as the semiconductor device formed on the main surface of the semiconductor substrate 1 in the first embodiment, the semiconductor device formed on the main surface of the semiconductor substrate is not limited to this.

Also, in the first embodiment, when forming the wiring 28 of the second wiring layer by the dual damascene process, the hole patterns are formed in the stopper insulating film 22 in advance and then the connection holes 24 in the film between via layers 21 and the wiring trenches 25 in the film between wiring layers 23 are simultaneously formed with using the cap insulating film 20 and the stopper insulating film 22 as etching stopper layers. However, the forming process is not limited to this. For example, the methods as follows are also available. That is: the method in which the connection holes 24 are formed in the film between wiring layers 23 and in the film between via layers 21 by the etching with using the photoresist film patterned into the hole shape as a mask and then the wiring trenches 24 are formed in the film between wiring layers 23 by the etching with using the photoresist film patterned into the trench shape as a mask; and the method in which the wiring trenches 25 are formed in the film between wiring layers 23 by the etching with using the photoresist film patterned into the trench shape as a mask and then the connection holes 24 are formed in the film between via layers 21 by the etching with using the photoresist film patterned into the hole shape as a mask.

As described above, according to the first embodiment, in which the film between wiring layers 15, the film between wiring layers 23, and the film between via layers 21 are comprised of an SiOC film made of a material with a relatively low dielectric constant and the stopper insulating films 14 and 22 and the cap insulating film 20 in contact with the film between wiring layers 15, the film between wiring layers 23 and the film between via layers 21 are comprised of an SiC film, it becomes possible to prevent the separation at the interface between the film between wiring layers 15 and the stopper insulating film 14 during the CMP process for forming the wiring 19 of the first wiring layer and the separation at the interface between the cap insulating film 20 and the film between via layers 21, at the interface between the film between via layers 21 and the stopper insulating film 22, and at the interface between the stopper insulating film 22 and the film between wiring layers 23 during the CMP process for forming the wiring 20 of the second wiring layer.

Second Embodiment

Figure 8:
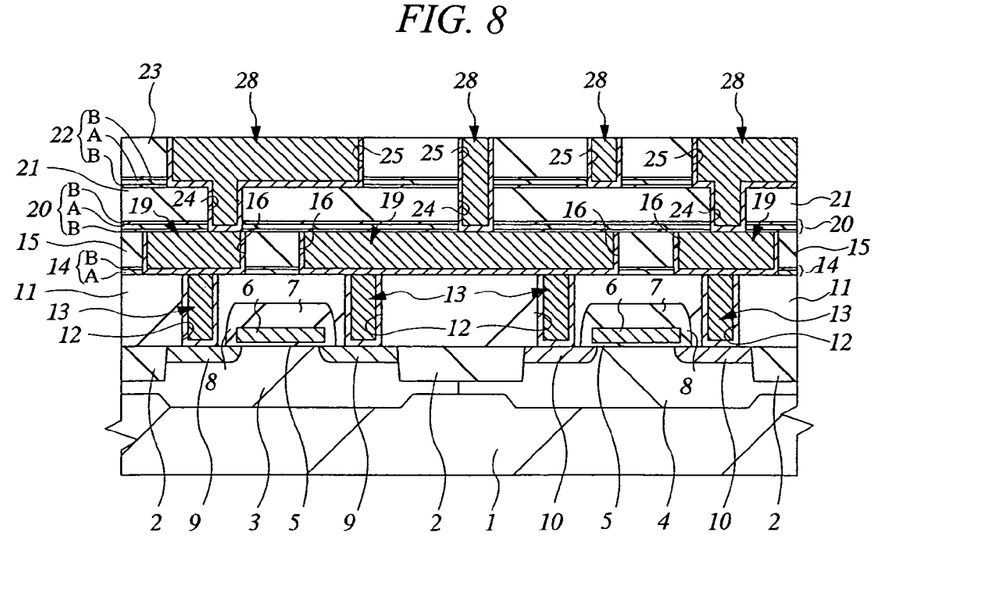
FIG. 8 is a sectional view showing the principal part of a semiconductor substrate which illustrates the manufacturing method of the CMOSFET according to the second embodiment of the present invention.

The manufacturing method of the CMOSFET according to the second embodiment of the present invention will be described with reference to the sectional view in FIG. 8 showing the principal part of the semiconductor substrate.

The case where the stopper insulating films 14 and 22 and the cap insulating film 20 are comprised of an SiC film has been described in the first embodiment. However, in this second embodiment, the stopper insulating films 14 and 22 and the cap insulating film 20 are comprised of an SiCN film A and an SiC film B, in which the SiCN film A can reduce the leakage current in comparison to the SiC film, and the SiC film B is interposed between the SiOC films constituting the film between wiring layers 15, the film between wiring layers 23, and the film between via layers 21 and the SiCN film A. The thickness of the SiCN film A is, for example, about 40 nm, and the thickness of the SiC film B is, for example, about 10 nm. Also, the nitrogen content of the SiCN film A is 1% or larger.

Also, the SiCN film A is formed by, for example, the plasma CVD method, and the film forming conditions thereof are as follows. That is, the rf power is 200 to 1000 W, the pressure is 2 to 10 Torr, the temperature is 300 to 400° C., the gas seed is C containing gas (e.g. alkylsilane), HN3 and He, and the gas flow rate is 100 to 2000 sccm. Also, the SiC film B is formed by, for example, the plasma CVD method, and the film forming conditions thereof are as follows. That is, the rf power is 200 to 1000 W, the pressure is 2 to 10 Torr, the temperature is 300 to 400° C., the gas seed is C containing gas (e.g. alkylsilane) and He, and the gas flow rate is 100 to 2000 sccm.

Figure 9:
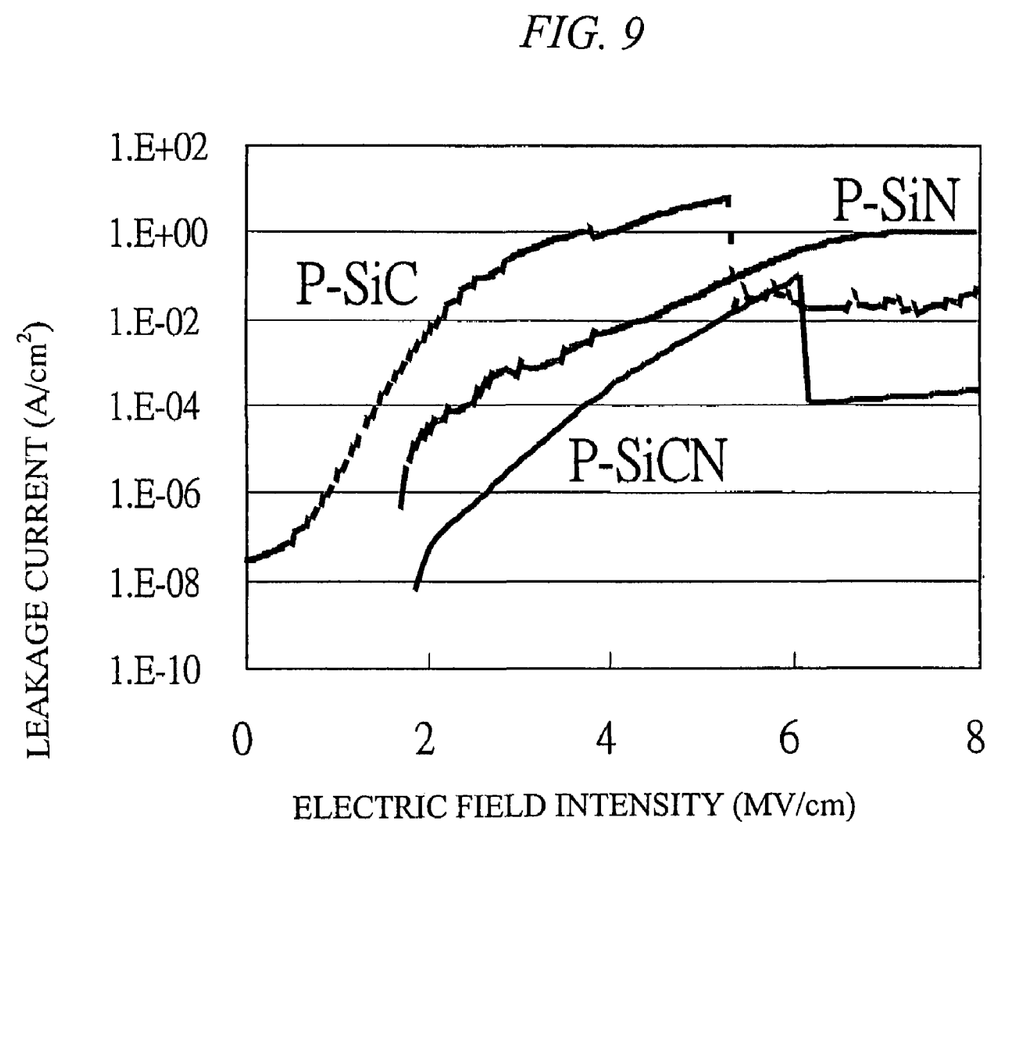
FIG. 9 is a graph showing the measurement results of the leakage current characteristics of the insulating films (SiC film, SiCN film, and SiN film)

FIG. 9 is a graph showing the measurement results of the leakage current characteristics of the three kinds of insulating films (SiC film, SiCN film, and SiN film) in which the horizontal axis represents the electric field intensity (MV/cm) and the vertical axis represents the leakage current of the films (A/cm$^2$). As is evident from the graph, at the electric field intensity of 3 MV/cm, the SiCN film shows the smallest leakage current and the SiC film shows the largest leakage current.

As described above, in the second embodiment, the stopper insulating films 14 and 22 and the cap insulating film 20 are mainly comprised of the SiCN film A with relatively small leakage current and the SiC film B is interposed between the SiOC film, which constitutes the film between wiring layers 15, the film between wiring layers 23, and the film between via layers 21, and the SiCN film A. By doing so, it becomes possible to reduce the leakage current between the wirings and to prevent the separation of the SiOC film.

Third Embodiment

In the third embodiment, an SiOC film which contains nitrogen is used to constitute the film between wiring layers 15, the film between wiring layers 23, and the film between via layers 21, and an SiCN film with relatively small leakage current is used to constitute the stopper insulating films 14 and 22 and the cap insulating film 20. The SiOC film which contains nitrogen is formed by, for example, the plasma CVD method, and the film forming conditions thereof are as follows. That is, the rf power is 200 to 1000 W, the pressure is 2 to 10 Torr, the temperature is 300 to 400° C., the gas seed is C containing gas (e.g. alkylsilane), O$_2$ and N$_2$, or C containing gas (e.g. alkylsilane) and $N_2O$, and the gas flow rate is 100 to 2000 sccm. Also, the SiCN film is formed by, for example, the plasma CVD method, and the film forming conditions thereof are as follows. That is, the rf power is 200 to 1000 W, the pressure is 2 to 10 Torr, the temperature is 300 to 400° C., the gas seed is C containing gas (e.g. alkylsilane), $NH_3$ and He, and the gas flow rate is 100 to 2000 sccm. The thickness of the SiCN film is, for example, about 50 nm.

As described above, according to the third embodiment, the adhesion therebetween can be improved by containing nitrogen in the SiOC film. In this manner, it is possible to reduce the leakage current between the wirings and simultaneously to prevent the separation of the SiOC film.

Fourth Embodiment

Figure 10:
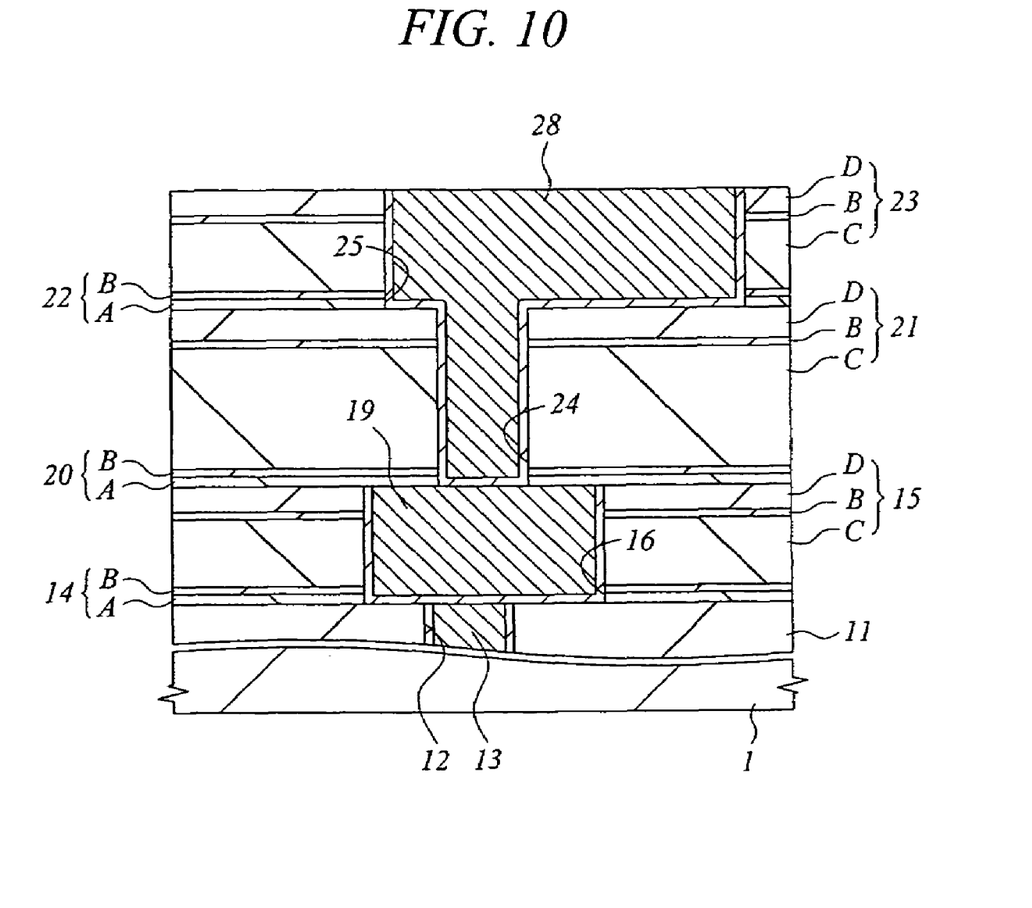
FIG. 10 is a sectional view showing the principal part of a semiconductor substrate which illustrates the CMOSFET according to the fourth embodiment of the present invention.

As shown in FIG. 10, in the fourth embodiment, the stopper insulating films 14 and 22 and the cap insulating film 20 are respectively formed of the laminated film of the SiCN film A and the SiC film B.

Figure 11:
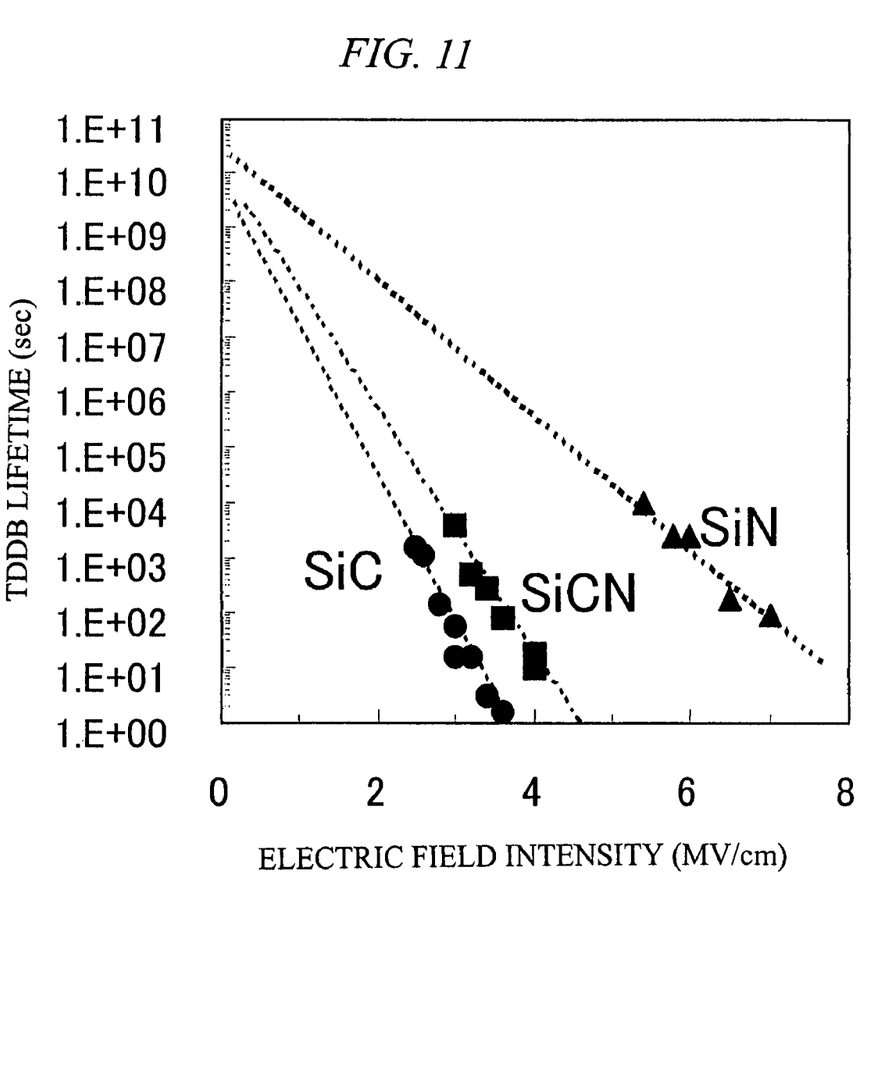
FIG. 11 is a graph showing the measurement results of the TDDB characteristics of the insulating films (SiC film, SiCN film, and SiN film)

FIG. 11 is a graph showing the measurement results of TDDB (Time-dependent dielectric breakdown) characteristics of the three kinds of insulating films (SiC film, SiCN film, and SiN film), in which the horizontal axis represents the electric field intensity (MV/cm) and the vertical axis represents the TDDB lifetime (second). As is evident from the graph, the TDDB lifetime of the SiCN film is longer than that of the SiC film.

Figure 12:
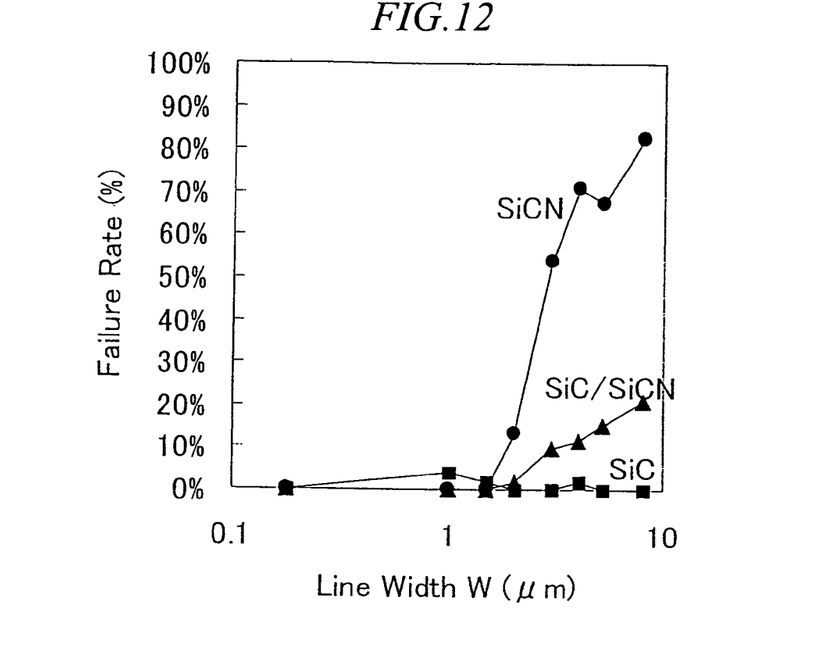
FIG. 12 is a graph showing the evaluation of the relationship between the stress migration characteristics of the copper wiring and each of the SiCN film and the SiC film.

Meanwhile, FIG. 12 is a graph showing the evaluation of the relationship between the stress migration characteristics of the copper wiring (via portion) and each of the SiCN film and the SiC film, in which the horizontal axis represents the width of the copper wiring (μm) and the vertical axis represents the failure rate (%) of the wiring due to the stress migration. As is evident from the graph, when the width of the copper wiring reaches a predetermined value or more, the stress migration characteristics of the copper wiring is remarkably deteriorated in the case of the SiCN film. On the other hand, the stress migration characteristics of the copper wiring are hardly deteriorated in the case of the SiC film regardless of the width of the copper wiring. In addition, the laminated film of the SiCN film and the SiC film shows the intermediate characteristics of these films.

As described above, the stopper insulating films 14 and 22 and the cap insulating film 20 are comprised of the laminated film of the SiCN film A and the SiC film B. By doing so, it becomes possible to prevent the deterioration of the TDDB characteristics of the stopper insulating films 14 and 22 and the cap insulating film 20 and also to reduce the leakage current. Furthermore, it is possible to prevent the deterioration of the stress migration characteristics of the copper wiring.

Note that, in the case where the stopper insulating films 14 and 22 and the cap insulating film 20 are respectively comprised of the laminated film of the SiCN film A and the SiC film B, the adhesion at the interface between the SiOC film, which constitutes the film between wiring layers 15, the film between wiring layers 23, and the film between via layers 21, and the SiCN film A is reduced. For its prevention, in this embodiment, the film between wiring layers 15, the film between wiring layers 23, and the film between via layers 21 are respectively comprised of a three-layered structure of an SiOC film C, an SiC film B, and an SiON film D so as to avoid the direct contact between the SiOC film C and the SiCN film A. In this case, the thin SiC film B between the SiOC film C and the SiON film D is an adhesion layer for improving the adhesion between the SiOC film C and the SiON film D. Also, in order to reduce the dielectric constant of the film between wiring layers 15, the film between wiring layers 23, and the film between via layers 20 as much as possible, it is desirable that the thickness of the SiON film D having the dielectric constant higher than the SiOC film C is made smaller than that of the SiOC film C, and also, the nitrogen content thereof is set smaller than 5 atoms % or less. The SiON film D is deposited by, for example, the plasma CVD method (forming temperature=350 to 400° C.) with using monosilane ($SiH_4$) and nitrogen monoxide ($N_2O$) as source gas.

Fifth Embodiment

In the case where the film between wiring layers 15, the film between wiring layers 23, and the film between via layers 21 are respectively comprised of the three-layered structure of an SiOC film C, an SiC film B, and an SiON film D as described in the fourth embodiment, since the etching selectivity of the SiC film B serving as an adhesion layer is different from that of the SiOC film C and the SiON film D, the SiC film B functions as an etching stopper in the etching process for forming the wiring trenches 16 and 25 and the connection holes 24. Consequently, the problem of reduction of the throughput occurs.

Figure 13:
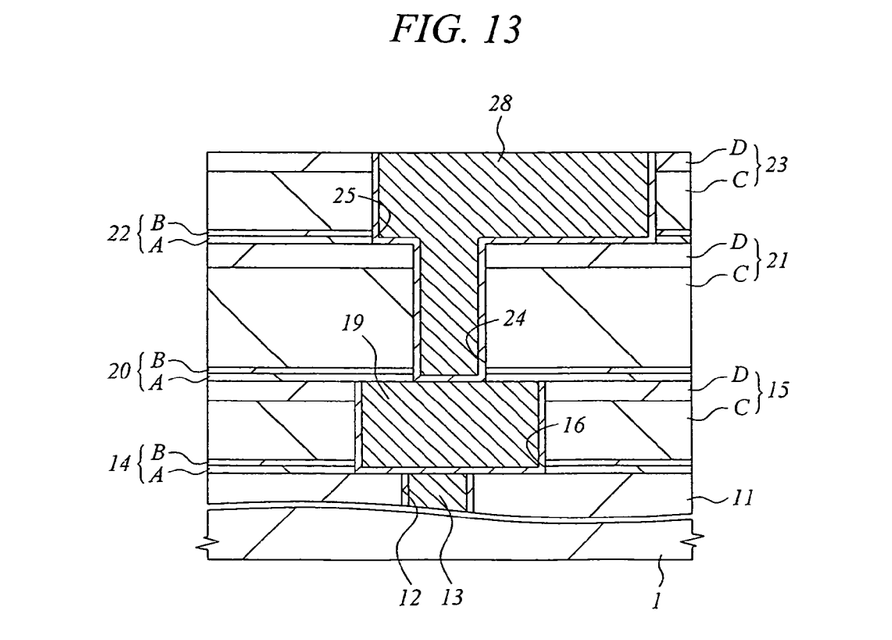
FIG. 13 is a sectional view showing the principal part of a semiconductor substrate which illustrates the CMOSFET according to the fifth embodiment of the present invention.

Therefore, in this embodiment, the film between wiring layers 15, the film between wiring layers 23, and the film between via layers 21 are respectively comprised of a two-layered structure of an SiOC film C and an SiON film D as shown in FIG. 13 so as to prevent the reduction of the throughput of the etching for forming the wiring trenches 16 and 25 and the connection holes 24.

Meanwhile, in the case where the SiC film B serving as an adhesion layer is not provided, the adhesion at the interface between the SiOC film C and the SiON film D is reduced, and the separation of the films frequently occurs.

One of the causes of the film separation is that the stress at the room temperature after forming the SiOC film C is 45 MPa (tensile stress) but the stress at 450° C. is −16 MPa (compressive stress), and thus, the film stress is changed from the tensile stress to the compressive stress, and the change amount thereof is large, that is, 61 MPa (45 MPa−(−16 MPa)).

For its solution, the SiOC film C is deposited at high temperature (for example, forming temperature of 375° C.). By doing so, the stress at the room temperature after forming the SiOC film C becomes 53 MPa (tensile stress), and the stress at 450° C. becomes 78 MPa (tensile stress). Therefore, the SiOC film C in which the change in stress due to the temperature change is small (the change amount is 25 MPa (78 MPa−53 MPa)) is obtained, and thus, the adhesion to the SiON film D can be improved. Also, after forming the SiOC film C, the helium (He) plasma process or oxygen plasma process is performed to its surface, and then, the SiON film is deposited. By doing so, the adhesion therebetween can be improved. Note that, in the case where the deposition temperature of the SiOC film C is too high and the plasma process is excessive, the dielectric constant of the SiOC film C is reduced. Therefore, it is preferable that the deposition temperature is set to 400° C. or lower and the plasma process time is set to 20 seconds or shorter (for example, about 15 seconds).

In addition, when depositing the SiON film D on the SiOC film C, the ratio of the monosilane and nitrogen monoxide serving as source gas is changed to obtain the film with the diffraction ratio of 1.485 or less and the nitrogen content of 3 to 4% or less. By doing so, the adhesion to the SiOC film C can be improved.

Sixth Embodiment

Figure 14:
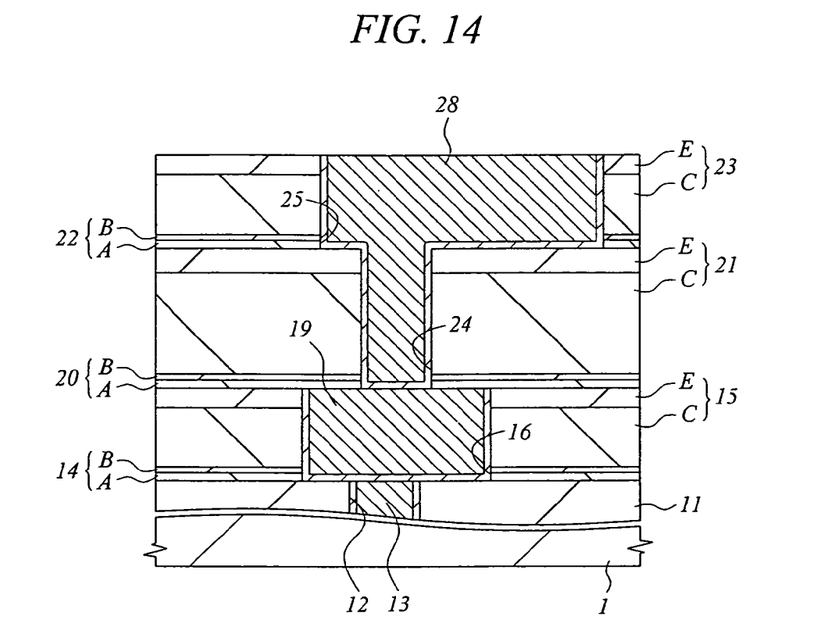
FIG. 14 is a sectional view showing the principal part of a semiconductor substrate which illustrates the CMOSFET according to the sixth embodiment of the present invention.

In the fifth embodiment, the film between wiring layers 15, the film between wiring layers 23, and the film between via layers 21 are respectively formed of the two-layered structure of the SiOC film C and the SiON film D, and the various processes for improving the adhesion therebetween are performed. In this embodiment, however, the film between wiring layers 15, the film between wiring layers 23, and the film between via layers 21 are respectively formed of the two-layered structure of the SiOC film C and an SiOCN film E as shown in FIG. 14. In this case, since the composition of the SiOCN film E is close to that of the SiOC film C in comparison to the SiON film D and good adhesion can be obtained, the various process for improving the adhesion between the films like those performed in the fifth embodiment is unnecessary.

The SiOCN film E can be deposited on the SiON film D by adding the nitrogen containing gas to the source gas in the middle of the deposition of the SiON film D and then continuing the deposition process. Note that it is desirable that the nitrogen concentration in the SiOCN film E is set to 10 atoms % or less in order to prevent the increase of the dielectric constant.

In addition, though not shown, the film between wiring layers 15, the film between wiring layers 23, and the film between via layers 21 can be formed of the two-layered structure of the SiOCN film E and the SiON film D. Since the composition of the SiOCN film E is close to that of the SiON film D in comparison to the SiOC film C and good adhesion can be obtained, the various process for improving the adhesion between the films like those performed in the fifth embodiment is unnecessary.

Seventh Embodiment

Figure 15:
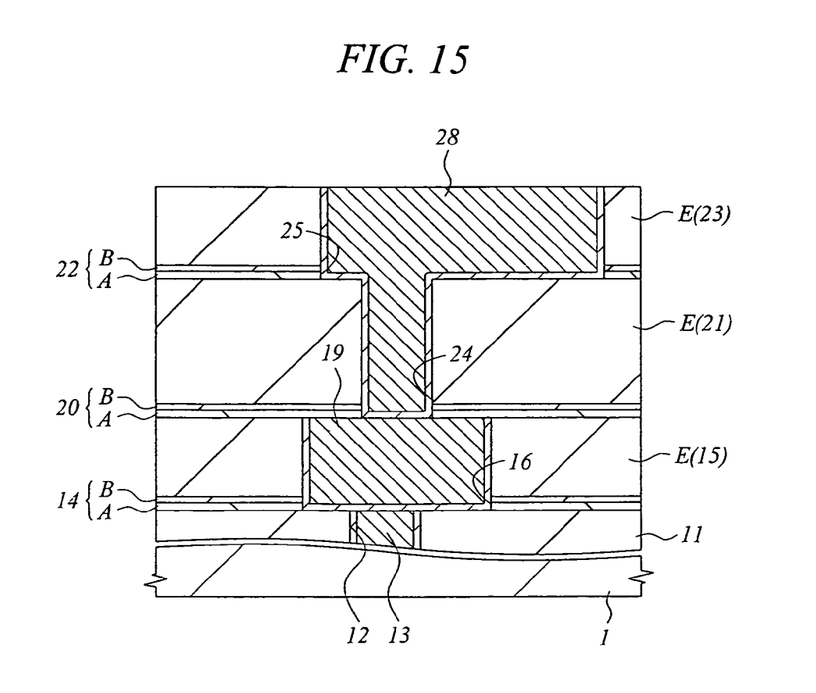
FIG. 15 is a sectional view showing the principal part of a semiconductor substrate which illustrates the CMOSFET according to the seventh embodiment of the present invention.

In this embodiment, as shown in FIG. 15, the film between wiring layers 15, the film between wiring layers 23, and the film between via layers 21 are respectively formed of the SiOCN film E. In this case, the dielectric constant is increased in comparison to the first and second embodiments in which the film between wiring layers 15, the film between wiring layers 23, and the film between via layers 21 are respectively formed of the SiOC film C. However, the process is significantly simplified in comparison to the fourth to sixth embodiments in which the film between wiring layers 15, the film between wiring layers 23, and the film between via layers 21 are respectively comprised of a plurality of films. In addition, since the composition of the SiOCN film E is close to the SiCN film A in comparison to the SiOC film C, the reduction in adhesion at the interface with the SiCN film A, which constitutes the part of the film between wiring layers 15, the film between wiring layers 23, and the film between via layers 21, is not hardly caused. Note that it is desirable that the nitrogen concentration in the SiOCN film E is set to 10 atoms % or less in order to prevent the increase of the dielectric constant.

In the foregoing, the invention made by the inventors thereof has been concretely described based on the embodiments. However, it goes without saying that the present invention is not limited to the foregoing embodiments and the various changes and modifications can be made within the scope of the present invention.

For example, in the fifth to seventh embodiments, it is also possible to form the stopper insulating films 14 and 22 and the cap insulating film 20 with only the SiCN film or only the SiC film.

Also, in the first to seventh embodiments, the case where the film made of low dielectric constant material is used to form the film between wiring layers and the film between via layers of the damascene copper wiring has been described. However, the present invention is not limited to this. For example, the present invention can be applied to the case where the interlayer insulating film made of a low dielectric constant material is formed on the wiring comprised of a refractory metal film such as aluminum alloy or tungsten formed by the use of, for example, the lithography technique and the dry etching process.

The present invention is the technique effectively applied to the semiconductor device including the copper wiring formed by the use of the damascene process and the interlayer insulating film with low dielectric constant.

What is claimed is:

1. A semiconductor device in which metal wiring is formed in trenches formed in an interlayer insulating film on a semiconductor substrate and a cap insulating film for preventing the diffusion of the metal which constitutes said wiring is formed over each of said interlayer insulating film and said metal wiring, wherein said interlayer insulating film is comprised of an SiOC film and an SiON film formed on said SiOC film, and said cap insulating film is comprised of an SiCN film and an SiC film formed on said SiCN film.

2. The semiconductor device according to claim 1, wherein said SiON film which constitutes a part of said interlayer insulating film has the nitrogen content of 3 to 4 atoms % or less.

3. The semiconductor device according to claim 1, wherein said SiON film which constitutes a part of said interlayer insulating film has a diffraction ratio of 1.485 or less.

4. The semiconductor device according to claim 1, wherein a stopper insulating film functioning as an etching stopper when etching said interlayer insulating film to form said trenches is formed at the intermediate portion of said interlayer insulating film, and said stopper insulating film is comprised of an SiCN film and an SiC film formed on said SiCN film.

5. A manufacturing method of a semiconductor device in which metal wiring is formed in trenches formed in an interlayer insulating film on a semiconductor substrate and a cap insulating film for preventing the diffusion of the metal which constitutes said wiring is formed over each of said interlayer insulating film and said metal wiring, said interlayer insulating film is comprised of an SiOC film and an SiON film formed on said SiOC film, and said cap insulating film is comprised of an SiCN film and an SiC film formed on said SiCN film, wherein, after forming said SiOC film which constitutes a part of said interlayer insulating film, the plasma treatment is performed to the surface of said SiOC film, and then, said SiON film is formed on said SiOC film.

6. The manufacturing method of a semiconductor device according to claim 5, wherein said SiOC film which constitutes a part of said interlayer insulating film is deposited by the plasma CVD method at the temperature of 375° C.

7. The manufacturing method of a semiconductor device according to claim 5, wherein said SiOC film which constitutes a part of said interlayer insulating film is deposited by the plasma CVD method so that the change in stress of the film is set to 50 MPa or less in the temperature range from the room temperature to 450° C.

8. A semiconductor device comprising:
a first insulating film formed over a semiconductor substrate and having a first wiring trench;
a first metal formed in the first wiring trench;
a second insulating film formed over the first metal and over the first insulating film;
a third insulating film formed over the second insulating film;
a fourth insulating film formed over the third insulating film and having a thickness greater than thicknesses of the second and third insulating films;
a contact hole formed in the fourth, third and second insulating films; and
a second metal formed in the contact hole;
wherein the first metal and the second metal have copper as a primary component,
wherein the second insulating film is composed of a material including silicon, carbon and nitrogen,
wherein the third insulating film is composed of a material including silicon and carbon,
wherein the fourth insulating film is composed of a material including silicon, oxygen and carbon and has a dielectric constant lower than a dielectric constant of a silicon oxide film, and
wherein a concentration of nitrogen in the second insulating film is higher than a concentration of nitrogen in the third insulating film.

9. A semiconductor device according to claim 8,
wherein the first insulating film comprises a first film and a second film,
wherein the first film is composed of a material including silicon, oxide and nitrogen,
wherein the second film is composed of a material including silicon, oxide and carbon.

10. A semiconductor device according to claim 9,
wherein the first film is formed between the second insulating film and the second film.

11. A semiconductor device according to claim 10, wherein the first film is in contact with the second insulating film.

12. A semiconductor device according to claim 11, wherein the first film has the nitrogen content of 3 to 4 atoms % or less.

13. A semiconductor device according to claim 11, wherein the first film has a diffraction ratio of 1.485 or less.

* * * * *